United States Patent
Yuasa et al.

(10) Patent No.: US 10,434,794 B2
(45) Date of Patent: Oct. 8, 2019

(54) OPTICAL PRINT HEAD AND IMAGE FORMING DEVICE

(71) Applicant: Konica Minolta, Inc., Tokyo (JP)

(72) Inventors: Takafumi Yuasa, Toyokawa (JP); Akira Taniyama, Hino (JP); Hidenari Tachibe, Toyokawa (JP)

(73) Assignee: KONICA MINOLTA, INC., Tokyo (JP)

(*) Notice: Subject to any disclaimer, the term of this patent is extended or adjusted under 35 U.S.C. 154(b) by 66 days.

(21) Appl. No.: 15/902,644

(22) Filed: Feb. 22, 2018

(65) Prior Publication Data

US 2018/0250952 A1    Sep. 6, 2018

(30) Foreign Application Priority Data

Mar. 1, 2017   (JP) .................................. 2017-038184

(51) Int. Cl.
| | |
|---|---|
| *B41J 2/45* | (2006.01) |
| *H04N 1/028* | (2006.01) |
| *H04N 1/03* | (2006.01) |
| *G02B 7/02* | (2006.01) |
| *B41J 2/447* | (2006.01) |
| *G03G 15/04* | (2006.01) |
| *H01L 51/00* | (2006.01) |

(52) U.S. Cl.
CPC .............. *B41J 2/451* (2013.01); *B41J 2/447* (2013.01); *B41J 2/45* (2013.01); *G02B 7/02* (2013.01); *G03G 15/04045* (2013.01); *H04N 1/02815* (2013.01); *H04N 1/0306* (2013.01); *H01L 51/0004* (2013.01)

(58) Field of Classification Search
CPC ... B41J 2/451; B41J 2/447; B41J 2/45; G03G 15/04045; H04N 1/0306; H04N 1/02815; G02B 7/02; H01L 51/0004
See application file for complete search history.

(56) References Cited

U.S. PATENT DOCUMENTS

| | | | |
|---|---|---|---|
| 2016/0268179 A1* | 9/2016 | Hiruta | H01L 23/3675 |
| 2017/0080700 A1* | 3/2017 | Landa | B41F 23/00 |
| 2017/0115592 A1* | 4/2017 | Yano | G03G 15/04054 |

FOREIGN PATENT DOCUMENTS

| | | |
|---|---|---|
| JP | 2006032615 A | 2/2006 |
| JP | 2011245775 A | 12/2011 |

* cited by examiner

*Primary Examiner* — Henok D Legesse
(74) *Attorney, Agent, or Firm* — Lucas & Mercanti, LLP

(57) ABSTRACT

An optical print head, including: an elongated substrate having a line-shaped region in which light-emitting elements are arranged; an optical member condensing light from the light-emitting elements onto an irradiation target; a holding member holding the optical member; a base member holding the substrate and the holding member; an integrated circuit mounted in a first region in proximity of an end in a longitudinal direction of the substrate on a first surface of the substrate facing the base member, heat being generated in the integrated circuit during optical writing; and a thermally conductive member between the integrated circuit and the base member. In the optical print head, the holding member has a support portion contacting the substrate in a second region at a position differing from the first region in plan view on a second surface of the substrate not facing the base member.

10 Claims, 9 Drawing Sheets

FIG. 4
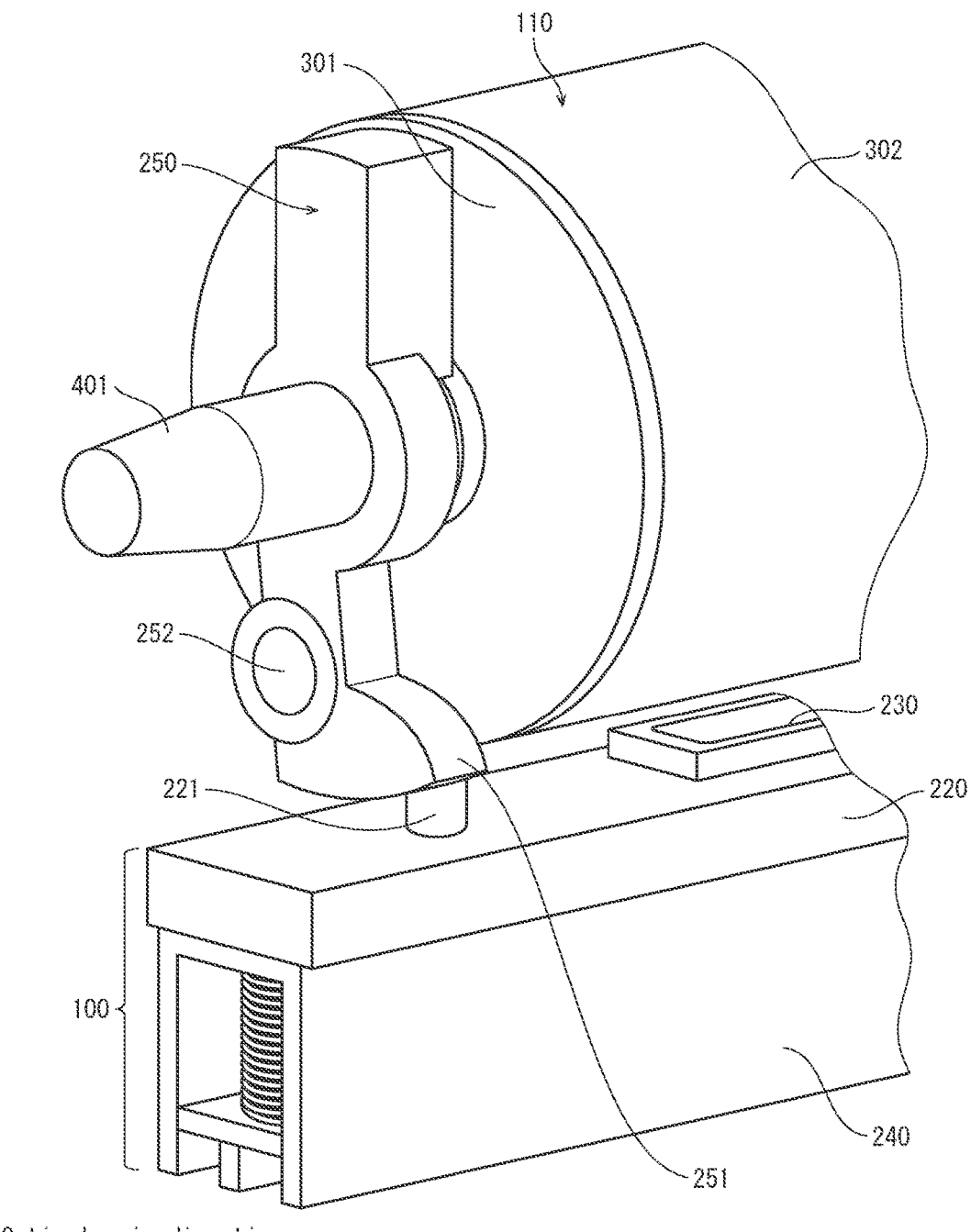
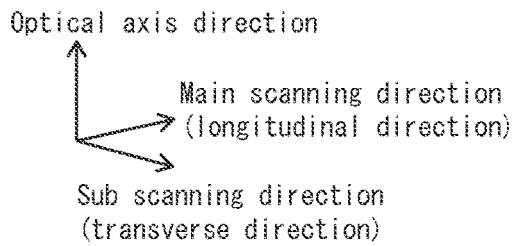

Optical axis direction

Main scanning direction
(longitudinal direction)

Optical axis direction

Main scanning direction
(longitudinal direction)

OPTICAL PRINT HEAD AND IMAGE FORMING DEVICE

This application claims priority to Japanese Patent Application No. 2017-038184 filed Mar. 1, 2017, the contents of which are hereby incorporated herein by reference in their entirety.

BACKGROUND

Technical Field

The present disclosure relates to optical print heads (also referred to as optical writing devices) and image forming devices, in particular to a technology for helping prevent image quality deterioration caused by heat from a semiconductor component that controls light amount emitted from the optical print head.

Description of the Related Art

Recently, in the technical field of electrophotographic image forming devices, optical print heads using organic light-emitting diodes (OLEDs) for light-emitting elements are developed in order to achieve downsizing and cost reduction.

As illustrated in FIG. 7 and FIG. 8, an optical print head 700 that uses OLEDs forms an electrostatic latent image through condensing light emitted from the OLEDs 712 onto an outer circumferential surface of a photoreceptor drum 750 with use of a lens array 730.

The lens array 730 includes many rod lenses 731 integrated with use of resin 732, and is held by a lens holder 720. The lens holder 720 is fixed by a base holder 740.

A rotational axis 752 of the photoreceptor drum 750 is supported by photoreceptor positioning members 751, and the lens holder 720 contacts the photoreceptor positioning members 751. This structure defines a distance from the lens array 730 to the outer circumferential surface of the photoreceptor drum 750.

The OLED panel 710 includes a glass substrate 711 and a thin film transistor (TFT) circuit 713 that includes the OLEDs 712 and that is disposed on the glass substrate 711. A light-emitting region on the glass substrate 711 is sealed by a sealing material 714 in order to protect the OLEDs 712 from external air. Through fixing the sealing material 714 to the base holder 740, the light-emitting region of the OLED panel 710 is positioned relative to the photoreceptor drum 750.

In proximity of one end in a longitudinal direction of the OLED panel 710, a driver integrated circuit (IC) 800 for switching on and off the OLEDs 712 is disposed outside the region sealed by the sealing material 714. That is, the OLED panel 710 is supported at only one end, and in a region around the driver IC 800, the OLED panel 710 is in contact with neither the lens holder 720 nor the base holder 740.

Temperature increase of the driver IC 800 occurring in accordance with optical writing operations may cause malfunction or the like. Accordingly, the driver IC 800 is cooled through heat dissipation. However, thermal expansion of the lens holder 720 and thermal expansion of the photoreceptor positioning members 751 caused by heat conducted through the lens holder 720 may occur in accordance with how heat is dissipated from the driver IC 800.

Such thermal expansion causes changes in positions of the components relative to each other and a reduction in condensing ratio of light emitted from the OLEDs 712 and condensed onto the outer circumferential surface of the photoreceptor drum 750, and consequently causes image quality deterioration. Accordingly, it is desirable that heat from the driver IC 800 be dissipated to the base holder 740.

In view of this, for example, conventional technology describes disposing a thermally conductive member 903 between a high heat generating part 901 and a display device fixing frame 902 as illustrated in FIG. 9 (see Japanese Patent Application Publication No. 2006-032615). Application of such conventional technology would help heat from the driver IC 800 to be dissipated to the base holder 740 through disposing a thermally conductive member between the driver IC 800 and the base holder 740.

However, when a thermally conductive member is disposed between the driver IC 800 and the base holder 740, a load is added around the driver IC 800 due to a reaction force from the thermally conductive member. When the OLED panel 710 deforms because of this load, the OLEDs 712 are displaced relative to the lens array 730 and the photoreceptor drum 740, and consequently condensing ratio of light emitted from the OLEDs 712 deteriorates.

One possible measure for overcoming this problem is to provide a support portion for supporting the lens holder 720 at a surface of the glass substrate 711 behind a surface of the glass substrate 711 on which the driver IC 800 is disposed. However, because the lens holder 720 is in contact with the photoreceptor positioning member 751, heat of the driver IC 800 may be conducted through the support portion to the lens holder 720 and the photoreceptor positioning member 751. Accordingly, it is not desirable to provide, on the glass substrate 711, a support portion for supporting the lens holder 720.

SUMMARY

The present disclosure has been achieved in view of the above problems, and an aim thereof is to provide an optical print head and an image forming device that help suppress displacement of OLEDs and conduction of heat from a driver IC to a lens holder.

To achieve at least one of the abovementioned objects, an optical print head reflecting at least one aspect of the present disclosure includes: an elongated light source substrate that has a line-shaped region in which a plurality of light-emitting elements are arranged; an optical member that condenses light emitted from the light-emitting elements onto an irradiation target; a holding member that holds the optical member; a base member that holds the light source substrate and the holding member; an integrated circuit that is mounted in a first region on a first surface of the light source substrate, the first surface facing the base member and the first region being in proximity of an end in a longitudinal direction of the light source substrate, heat being generated in the integrated circuit during optical writing; and a thermally conductive member that is disposed between the integrated circuit and the base member, wherein the holding member has a support portion contacting the light source substrate in a second region on a second surface of the light source substrate, the second surface not facing the base member and the second region being at a position differing from the first region in plan view.

BRIEF DESCRIPTION OF THE DRAWINGS

The advantages and features provided by one or more embodiments of the disclosure will become more fully understood from the detailed description given hereinbelow In the Drawings:

FIG. 4 is an external perspective view of a structure of a positioning member 250;

DETAILED DESCRIPTION

Hereinafter, one or more embodiments of the present invention will be described with reference to the drawings. However, the scope of the invention is not limited to the disclosed embodiments.

The following describes an embodiment of an optical print head and an image forming device pertaining to the present disclosure, with reference to the drawings.

[1] Structure of Image Forming Device

The following describes a structure of an image forming device pertaining to the present embodiment.

Figure 1:
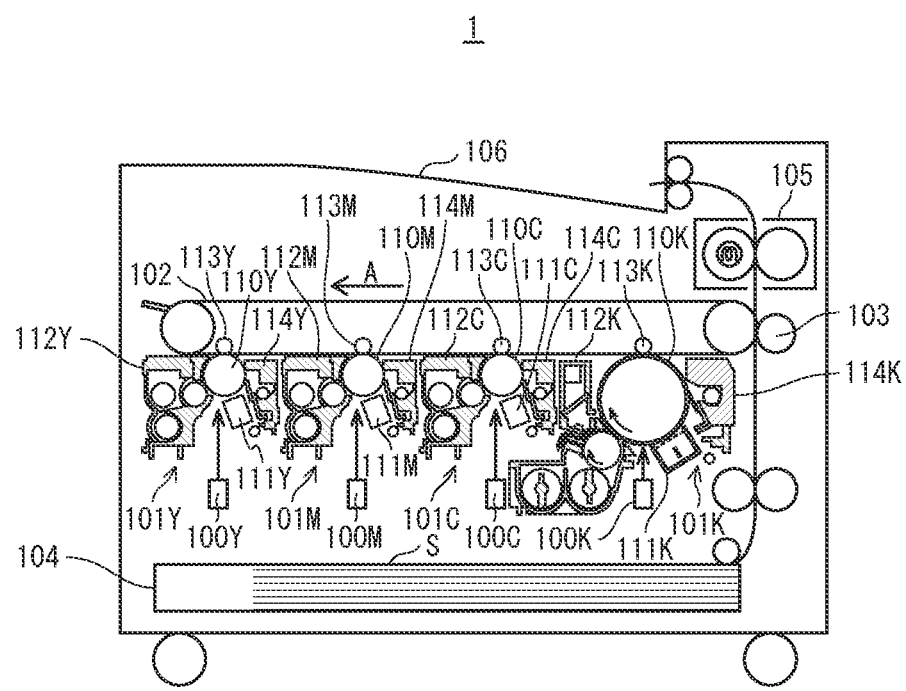
FIG. 1 is a schematic diagram of main components of an image forming device pertaining to a first embodiment of the present disclosure.

In FIG. 1, an image forming device 1 is a so-called tandem-type color printer device, and includes image forming units 101Y, 101M, 101C, and 101K forming images of colors yellow (Y), magenta (M), cyan (C), and black (K), respectively. The image forming unit 101Y includes an optical print head 100Y, a photoreceptor drum 110Y, an electricity charging device 111Y, a developing device 112Y, and a cleaning device 114Y. Similarly, the image forming unit 101M includes an optical print head 100M, a photoreceptor drum 110M, an electricity charging device 111M, a developing device 112M, and a cleaning device 114M; the image forming unit 101C includes an optical print head 100C, a photoreceptor drum 110C, an electricity charging device 111C, a developing device 112C, and a cleaning device 114C; and the image forming unit 101K includes an optical print head 100K, a photoreceptor drum 110K, an electricity charging device 111K, a developing device 112K, and a cleaning device 114K.

When forming a color image, the image forming units 101Y, 101M, 101C, and 101K respectively cause outer circumferential surfaces of the photoreceptor drums 110Y, 110M, 110C, and 110K to be uniformly charged by the electricity charging devices 111Y, 111M, 111C, and 111K. Then the image forming units 101Y, 101M, 101C, and 101K respectively cause the optical print heads 100Y, 100M, 100C, and 100K to each form an electrostatic latent image, and respectively cause the developing devices 112Y, 112M, 112C, and 112K to develop the electrostatic latent images.

Primary transfer rollers 113Y, 113M, 113C, and 113K electrostatically transfer the toner images of the colors Y, M, C, and K respectively carried on the outer circumferential surfaces of the photoreceptor drums 110Y, 110M, 110C, and 110K onto an intermediate transfer belt 102 in sequence, so that the toner images overlap each other. A color toner image is thus formed. Then, toner remaining on the outer circumferential surfaces of the photoreceptor drums 110Y, 110M, 110C, and 110K is removed by the cleaner devices 114Y, 114M, 114C, and 114K, respectively.

The intermediate transfer belt 102 is an endless belt, and rotates in a direction indicated by arrow A in order to convey the color toner image to a second transfer roller pair 103. In accordance with this, a recording sheet S contained in a sheet feed tray 104 is picked up and conveyed to the secondary transfer roller pair 103. Then the color toner image on the intermediate transfer belt 102 is electrostatically transferred onto the recording sheet S. Then the color toner image on the recording sheet S is thermally fixed by a fixing device 105, and the recording sheet S is ejected onto a sheet ejection tray 106.

Because the following description applies to all of the optical print heads 100Y, 100M, 100C, and 100K irrespective of their toner colors, the letters Y, M, C, and K in the reference signs are hereinafter omitted.

[2] Structure of Optical Print Head 100

The following describes a structure of the optical print head 100.

Figure 2:
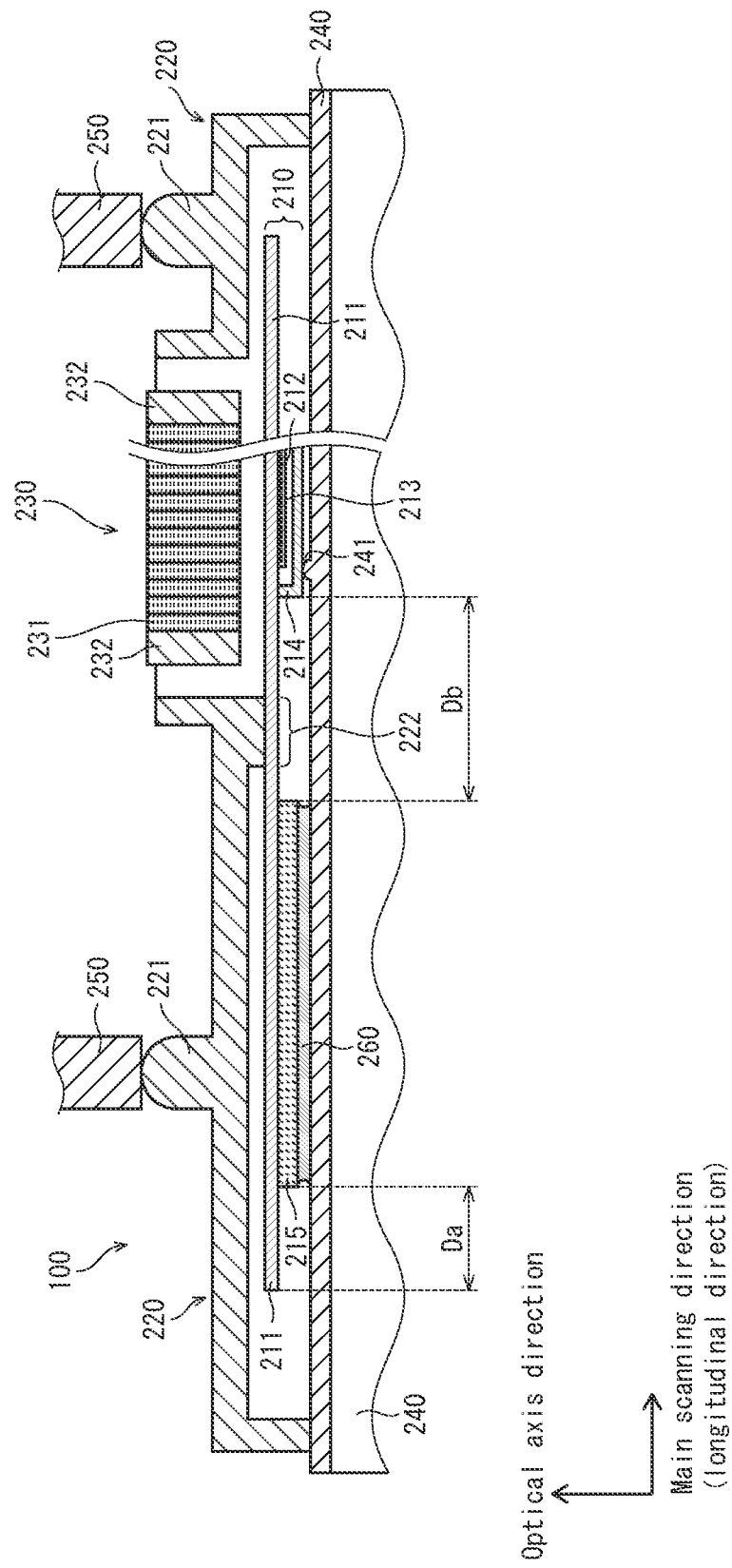
FIG. 2 is a cross-sectional view of main components of an optical print head 100.
Figure 3:
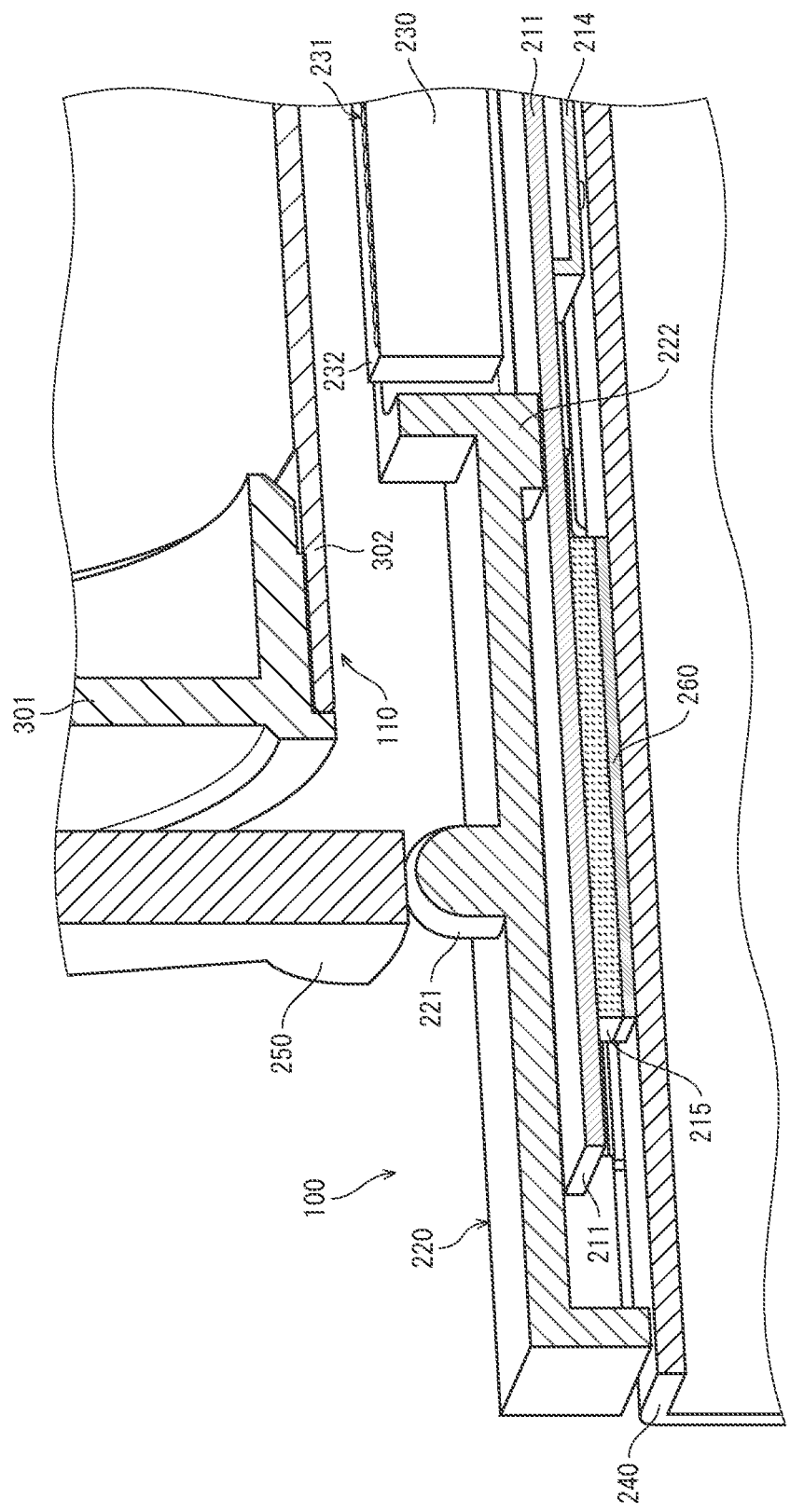
FIG. 3 is a cross-sectional perspective view of one end of the optical print head 100.

In FIG. 2 and FIG. 3, the optical print head 100 includes an OLED panel 210, a lens holder 220, a lens array 230, and a base holder 240. The OLED panel 210 is a light emitting substrate elongated in a main scanning direction and has a thin film transistor (TFT) circuit 213 including a plurality of (for example, 15,000) organic light-emitting elements (OLEDs) 212 arranged in a line-shaped region on a glass substrate 211.

A driver integrated circuit (IC) 215 is connected to the TFT circuit 213, and during optical writing, the driver IC 215 turns on and off the OLEDs 212 in accordance with image data. The OLEDs 212 are arrayed in a line or a plurality of lines in a staggered pattern, and the light-emitting region including the OLEDs 212 is sealed by a sealing member 214 in order to protect the OLEDs 212 from dust.

The sealing member 214 is in contact with a support portion 241 of the base holder 240. The support portion 241 may be a semispherical protrusion or hardened adhesive. The sealing member 214 contacts the support portion 241 to position the OLED panel 210. The base holder 240 is a member molded out of a sheet metal. The sheet metal material for the base holder 240 is a steel material such as stainless steel (SUS) having thermal conductivity Kh of approximately 20 W/m·K.

Heat from the driver IC 215 is conducted through a thermally conductive silicone member 260 to the base holder 240. The thermally conductive silicone member 260 may be silicone grease applied to the driver IC 215 and hardened, or may be a sheet-like silicone member sandwiched between the driver IC 215 and the base holder 240.

A region A from an end in a longitudinal direction of the glass substrate 211 to the driver IC 215 has a length Da that is shorter than a length Db of a region B from the sealing member 214 to the driver IC 215. Because the glass substrate 211 has a constant width in a transverse direction irrespective of positions in the longitudinal direction, the region A has a smaller area than the region B. A glass material for the glass substrate 211 has thermal conductivity Kp of approximately 1.0 W/m·K.

The lens array 230 includes a plurality of rod lenses 231 arranged in two or more rows in the main scanning direction in a staggered pattern and fixed by resin 232. The lens array 230 condenses light P emitted from the OLEDs 212 onto the outer circumferential surface of the photoreceptor drum 110. For example, a SELFOC lens array (SLA; SELFOC is a registered trademark of Nippon Sheet Glass Co. Ltd.) may be used for the lens array 230.

The lens holder 220 includes resin and is fixed to the base holder 240 with the lens array 230 held by the lens holder 220. The lens holder 220 has, in proximity of each end in a longitudinal direction of the lens holder 220, a protrusion 221. Each protrusion 221 has a semispherical tip that contacts a corresponding one of positioning members 250 of the photoreceptor drum 110. This structure defines positions relative to each other of the outer circumferential surface of the photoreceptor drum 110, the rod lenses 231, and the OLEDs 212. The resin material for the lens holder 220 has thermal conductivity Ks ranging from 0.4 W/m·K to 0.5 W/m·K.

For the resin material for the lens holder 220, for example, orienting resin obtained through adding a reinforcing agent such as glass fiber to a general-purpose engineering plastic can be used. Alternatively, resin that does not include glass fiber may be used. For the general-purpose engineering plastic, liquid crystal polymer resin, polycarbonate, synthetic resin of polycarbonate and acrylonitrile butadiene styrene (ABS) resin, synthetic resin of polycarbonate and polystyrene, or the like may be used.

In FIG. 4, a positioning member 250 has an end surface 251 contacting a protrusion 221. The photoreceptor drum 110 includes a flange portion 301, a drum portion 302, and a rotational axis 401. The rotational axis 401 passes through the positioning member 250. Further, the positioning member 250 is screwed to the housing (not illustrated) of the image forming unit 101 at a middle portion 252 between a portion of the positioning member 250 through which the rotational axis 401 passes and the end surface 251.

The lens holder 220 has a support portion 222. The support portion 222 contacts a main surface of the glass substrate 211 facing the lens array 230. Further, the support portion 222 contacts the glass substrate 211 at a position in a longitudinal direction between the driver IC 215 and the support portion 241 of the base holder 240.

Note that components such as cables for connecting the optical print head 100 and other portions of the image forming device 1 are not illustrated in FIG. 2, FIG. 3, or FIG. 4.

[3] Suppression of Displacement of OLEDs 212 in Optical Axis Direction

Grease silicone shrinks when hardened. Further, a silicone sheet shrinks in an optical axis direction (direction parallel to optical axes of the rod lenses 731) after being fitted to the driver IC 215 and the base holder 240. When the thermally conductive silicone member 260 shrinks, while the base holder 240 does not deform due to having high rigidity, the glass substrate 211 deflects due to having low rigidity. When the glass substrate 211 deflects, the driver IC 215 is attracted toward the base holder 240.

In cases where the lens holder 220 does not have the support portion 222 and the glass substrate 211 deflects with the support portion 241 of the base holder 240 serving as a fulcrum due to a load that corresponds to a reaction force from the thermally conductive silicone member 260, a light-emitting region of the glass substrate 211 where the OLEDs 212 are mounted deflects toward the base holder 240. This causes the OLEDs 212 to be displaced in the optical axis direction. When the OLEDs 212 are displaced and a distance from the OLEDs 212 to the outer circumferential surface of the photoreceptor drum 110 changes, condensing ratio of light emitted from the OLEDs 212 becomes lower. This leads to image quality deterioration.

The reaction force causes the glass substrate 211 between the driver IC 215 and the light-emitting region of the glass substrate 211 to deflect toward the lens holder 220. In contrast, in the present embodiment, the support portion 222 of the lens holder 220 contacts the glass substrate 211 between the driver IC 215 and the light-emitting region of the glass substrate 211. This structure helps prevent the glass substrate 211 from deflecting toward the lens holder 220. As a result, the light-emitting region of the glass substrate 211 can be prevented from deflecting toward the base holder 240.

[4] Suppression of Conduction of Heat from Driver IC 215 to Lens Holder 220

As described above, the support portion 222 of the lens holder 220 contacts the glass substrate 211 at a position in the longitudinal direction between the driver IC 215 and the support portion 241 of the base holder 240. Accordingly, in order for heat from the driver IC 215 to be conducted to the lens holder 220, the heat is conducted through the glass substrate 211.

However, the glass substrate 211 has low thermal conductivity due to including a glass material, which has low thermal conductivity, and due to having small thickness in the optical axis direction. Accordingly, less heat from the driver IC 215 is conducted to the lens holder 220 compared to structures in which the heat conduction path from the driver IC 215 to the lens holder 220 has a minimum length due to disposition of the support portion 241 at a position overlapping the driver IC 215 in plan view from the optical axis direction.

Also, heat from the driver IC 215 is dissipated through the thermally conductive silicone member 260 to the base holder 240. This further helps reduce heat amount conducted from the driver IC 215 to the lens holder 220.

Thus, the structure pertaining to the present embodiment helps suppress heat amount conducted from the driver IC 215 to the lens holder 220. This helps prevent a decrease in condensing ratio of light emitted from the OLEDs 212 caused by thermal deformation of the lens holder 220 and the positioning members 250, and consequently helps prevent image quality deterioration.

Structures in which the positioning members 250 contact the base holder 240 incur high costs because sheet metal working is used in order to provide the base holder 240 with protrusions contacting the positioning members 250. In contrast, the lens holder 220 is formed through resin molding with use of a metal mold. That is, the protrusion is formed by simply using a metal mold designed for forming the lens holder 220 along with the protrusion 221. This helps reduce costs because a process of working each instance of the lens holder 220 is not necessary.

Further, in structures in which the positioning members 250 contact the base holder 240, heat conducted from the driver IC 215 through the thermally conductive silicone member 260 to the base holder 240 may further be conducted to the positioning members 250. This may cause image quality deterioration due to thermal deformation of the positioning members 250. As described above, the present embodiment helps prevent such image quality deterioration.

[5] Suppression of Conduction of Heat Making Use of Thermal Resistance

As described above, the glass substrate 211 has a smaller area in the region A than in the region B. Accordingly, the region B has greater thermal resistance, and thus suppresses heat increase to a greater extent than the region A. Accordingly, the structure of the present embodiment in which the support portion 222 contacts the region B has a greater effect of helping suppression of conduction of heat from the driver IC 215 to the lens holder 220 compared to structures in which the support portion 222 contacts the region A.

[6] Suppression of Bending Moment

The support portion 222 of the lens holder 220 contacts the OLED panel 210 at a position differing in the longitudinal direction from the position of the support portion 241 of the base holder 240. Specifically, in the present embodiment, the support portion 222 contacts the glass substrate 211 at a position closer to the driver IC 215 than the support portion 241. Such a structure helps suppress bending moment of the OLED panel 210, and consequently helps prevent the OLEDs 212 from being displaced in the optical axis direction.

[7] Control of Thermal Conductivity Making Use of Differences in Thermal Conductivity between Materials Typically, a material having low thermal conductivity has great thermal resistance. Accordingly, a glass substrate 211 including a material having low thermal conductivity helps suppress conduction of heat from the driver IC 215, which is disposed on the glass substrate 211, through the glass substrate 211 to other components. This structure helps improve heat dissipation efficiency through helping heat from the driver IC 215 to be conducted through the thermally conductive silicone member 260 to the base holder 240.

When thermal conductivity Ks of the resin material for the lens holder 220 is lower than thermal conductivity Kp of the glass material for the glass substrate 211 and lower than thermal conductivity Kh of the sheet metal material for the base holder 240, conduction of heat to the lens holder 220 and conduction of heat through the lens holder 220 to the positioning members 250 can further be suppressed.

[8] Modifications

Although description of the present invention has been provided with reference to an embodiment of the present invention, the present invention should not be construed as being limited to the above embodiment, and for example the following modifications are possible.

Figure 5A:
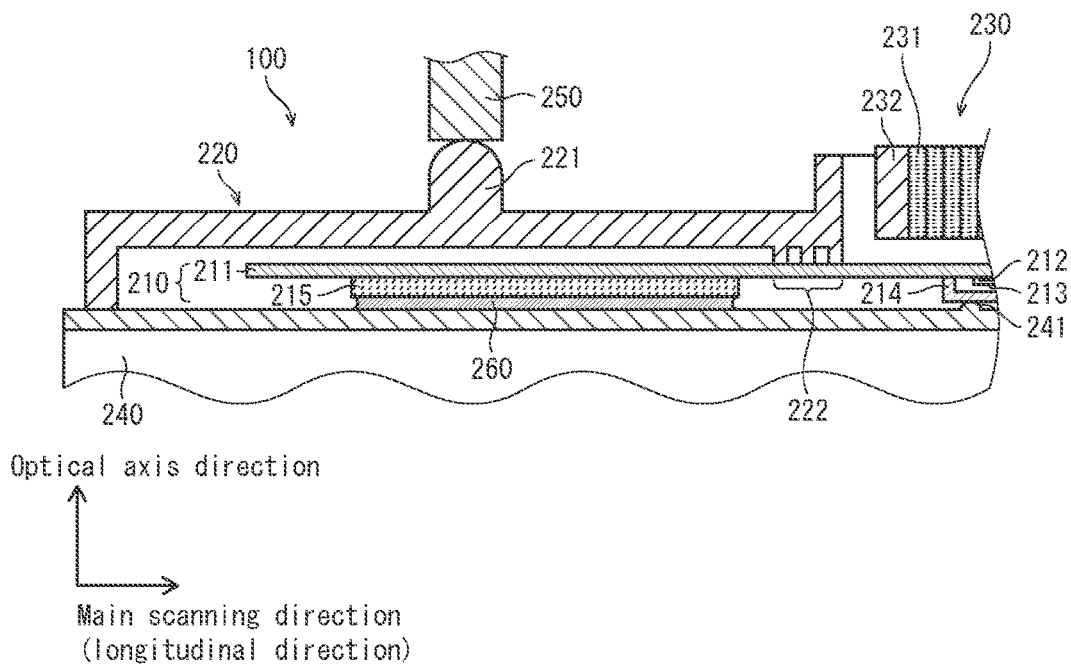
FIG. 5A is a cross-sectional view of a shape of a support portion 222 pertaining to a modification of the present disclosure.
Figure 5B:
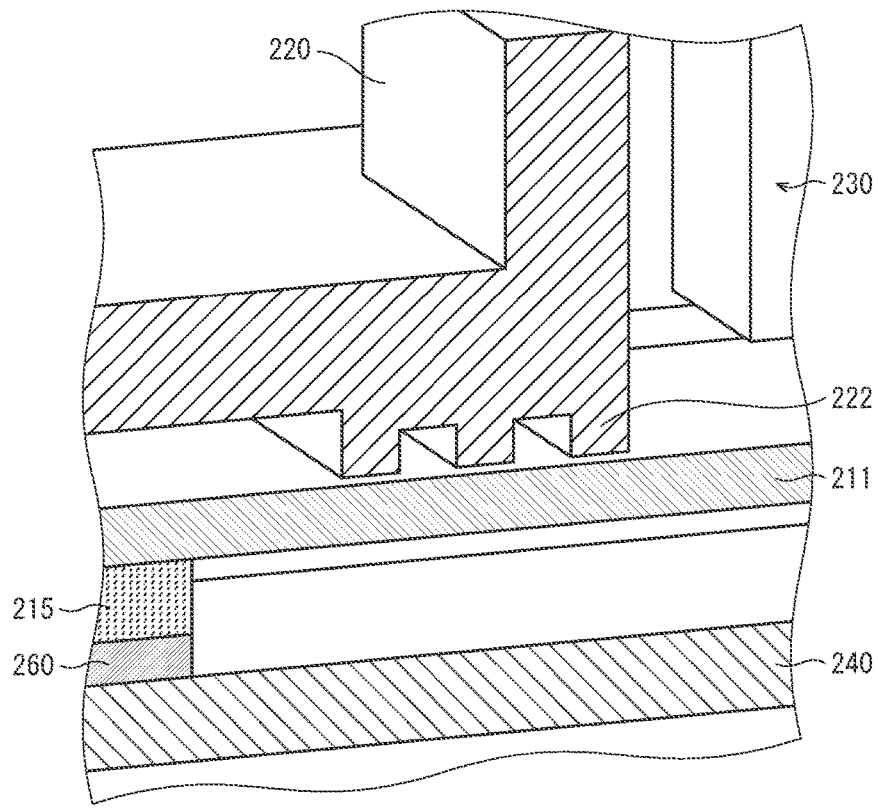
FIG. 5B is a cross-sectional perspective view of a shape of the support portion 222 pertaining to the modification of the present disclosure.

(1) The above embodiment takes a case in which a tip of the support portion 222 of the lens holder 220 is flat as an example. However, the present invention of course should not be construed as being limited to this, and may be configured as follows. When the tip of the support portion 222 is notched, and consequently has a large surface area as in FIG. 5A and FIG. 5B, the support portion 222 has great heat dissipating property. This consequently helps suppress conduction of heat from the driver IC 215 through the glass substrate 211 and the support portion 222 to a main body of the lens holder 220 and the positioning members 250.

The notches at the tip of the support portion 222 may be grooves or a plurality of protrusions.

Figure 6A:
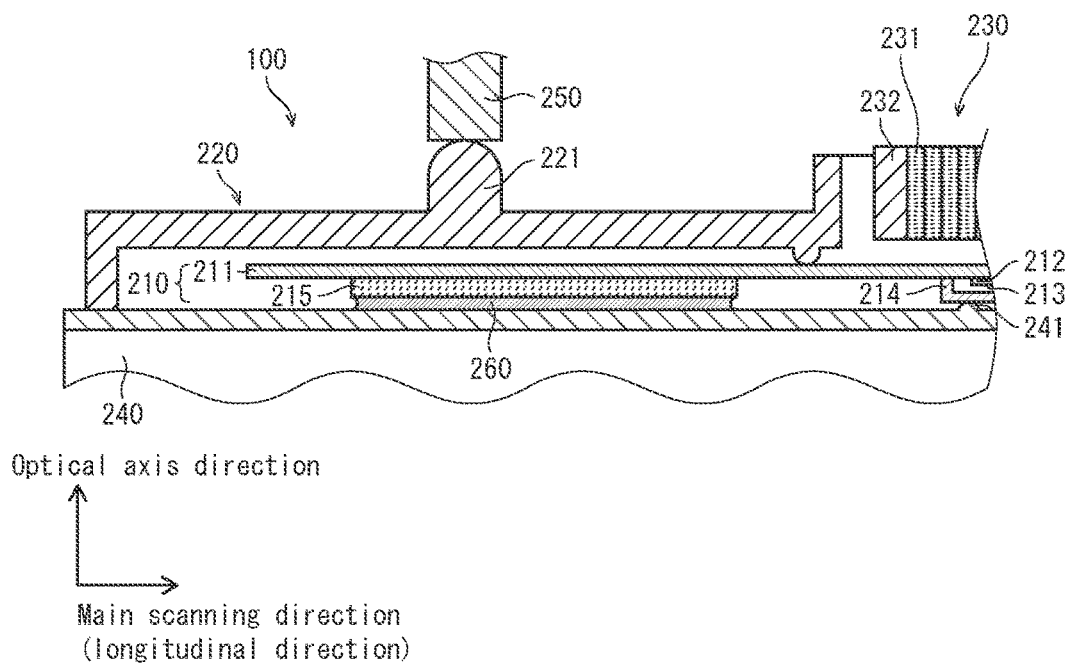
FIG. 6A is a cross-sectional view of a shape of a support portion 222 pertaining to a modification of the present disclosure.
Figure 6B:
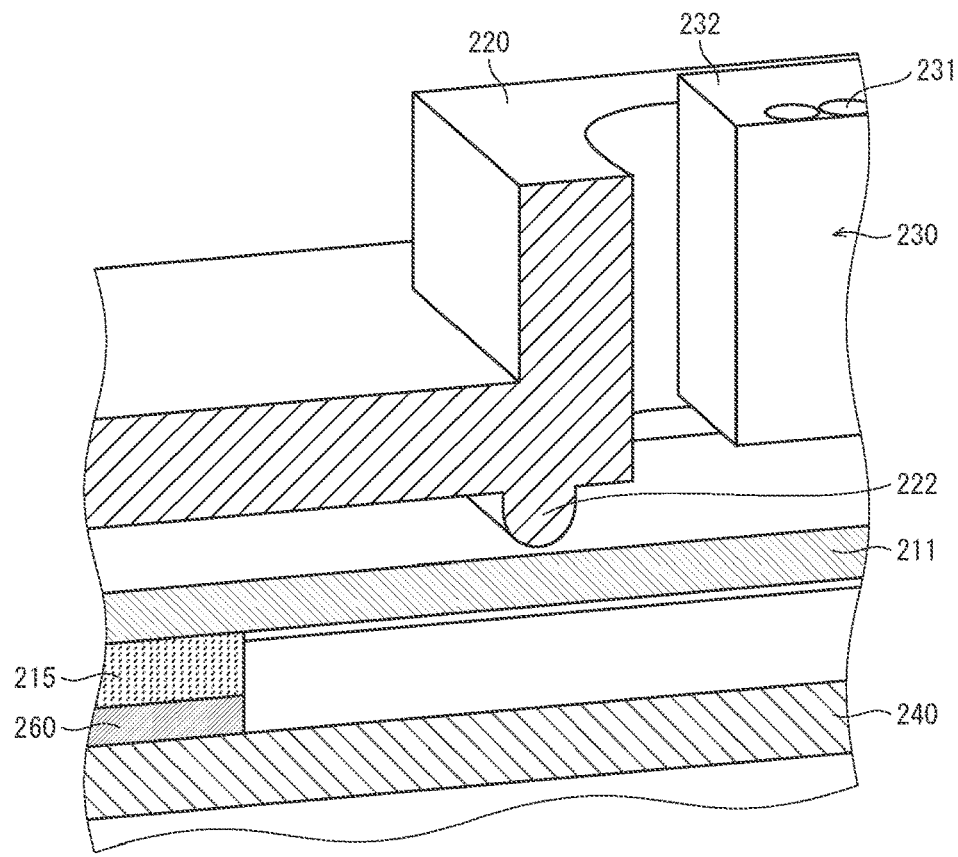
FIG. 6B is a cross-sectional perspective view of a shape of the support portion 222 pertaining to the modification of the present disclosure.
Figure 7:
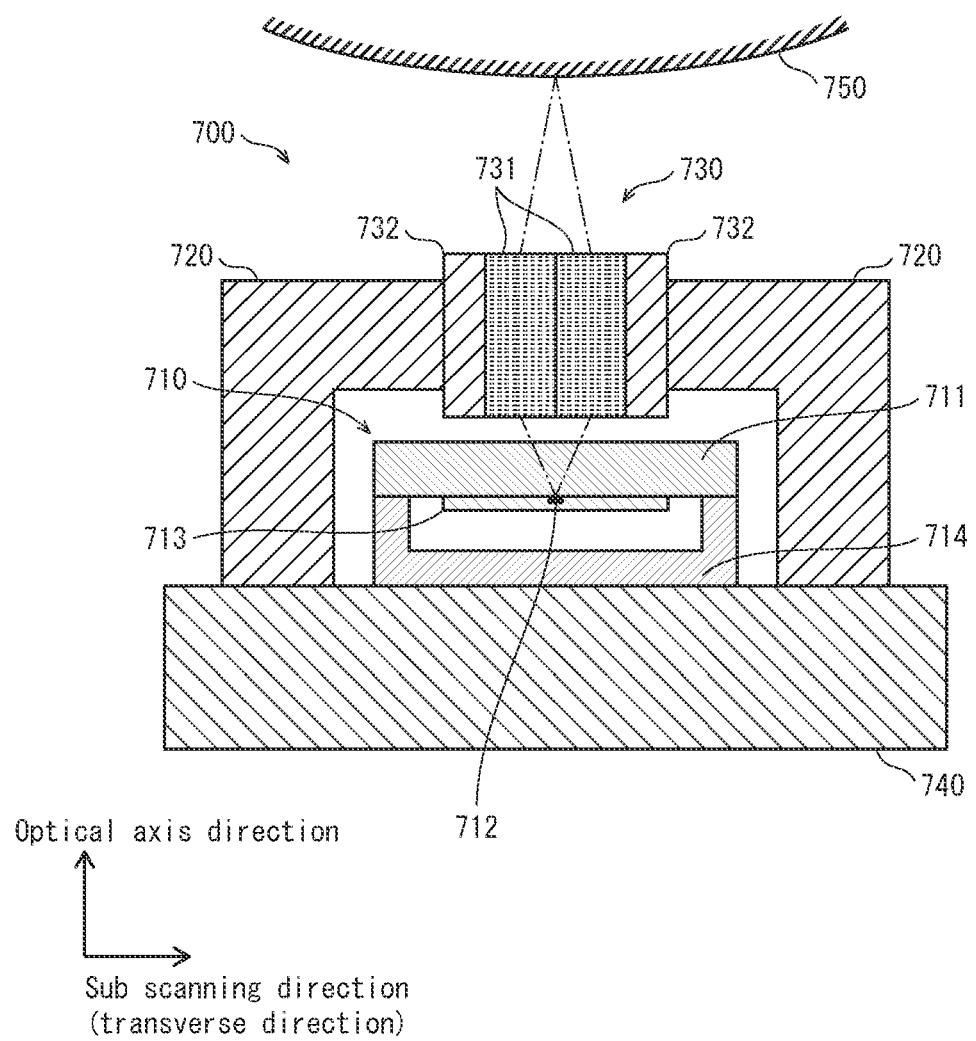
FIG. 7 is a cross-sectional view of main components of an optical print head pertaining to conventional technology, taken along a cross-section orthogonal to a main scanning direction.
Figure 8:
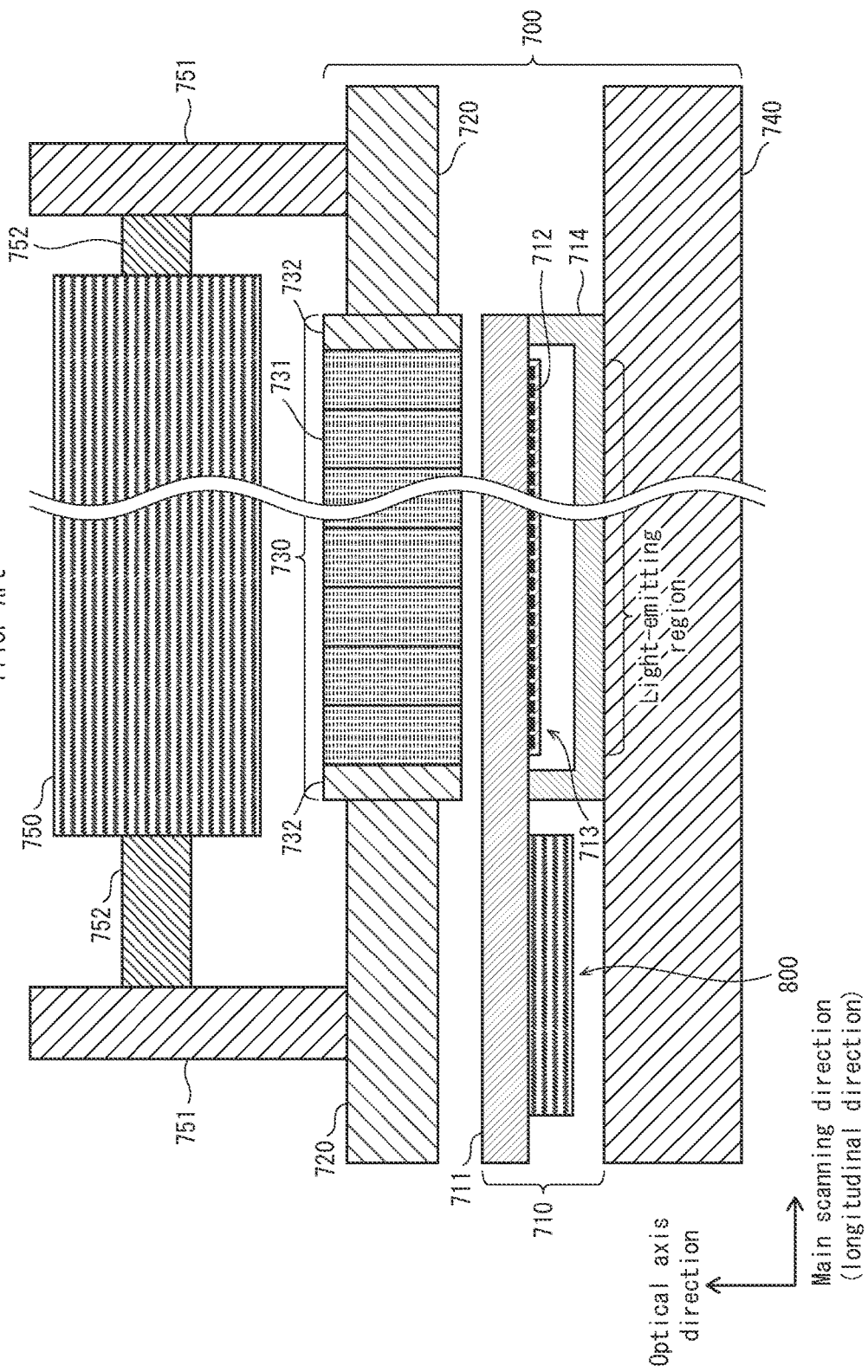
FIG. 8 is a cross-sectional view of main components of the optical print head pertaining to conventional technology, taken along a cross-section orthogonal to a sub scanning direction.
Figure 9:
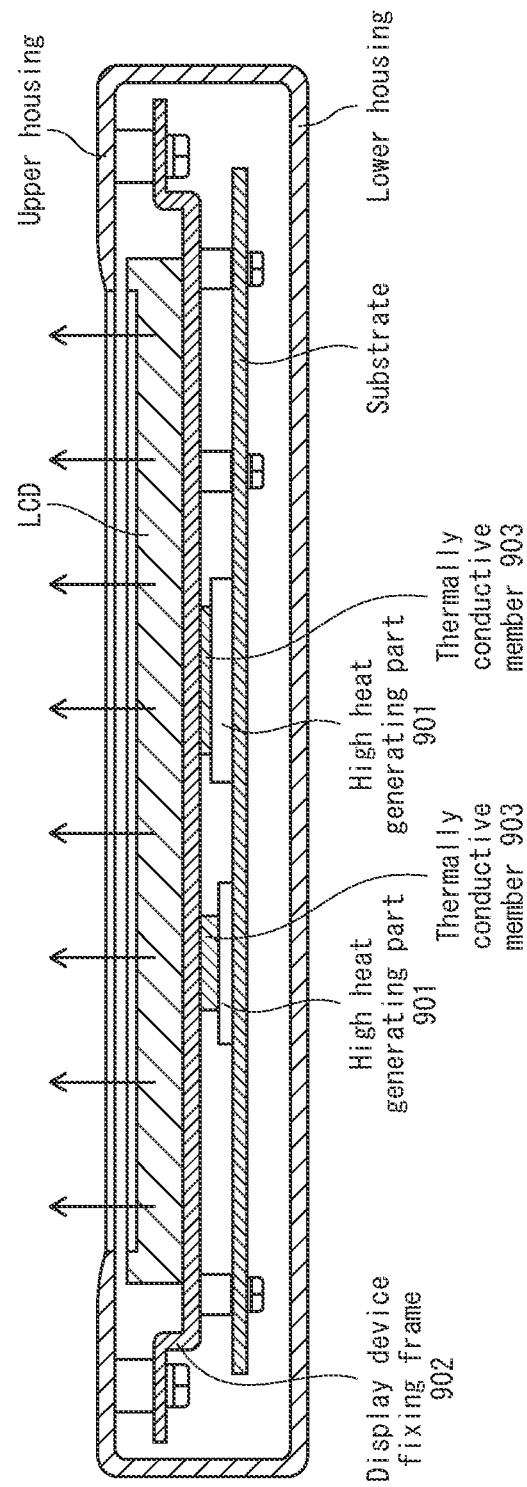
FIG. 9 is a cross-sectional view of how heat is dissipated from high heat generating parts pertaining to conventional technology.

Further, the tip of the support portion 222 may be rounded as in FIG. 6A and FIG. 6B. In such a structure, contacting area between the glass substrate 211 and the lens holder 220 is small, and this helps suppress conduction of heat from the driver IC 215 to the lens holder 220 and the positioning members 250.

(2) In the above embodiment, description is given taking a case in which the base holder 240 has the support portion 241 as an example. However, the present invention of course should not be construed as being limited to this, and may be configured as follows. For example, when a surface of the base holder 240 facing the OLED panel 210 is a flat surface that does not have the support portion 241 and the OLED panel 210 is fixed to the base holder 240 with the flat surface in surface contact with the sealing member 214, the support portion 222 of the lens holder 220 may contact the glass substrate 211 at a position in the longitudinal direction between the driver IC 215 and a position at which the sealing member 214 is fixed to the base holder 240.

The effects of the present invention can be achieved in structures in which the support portion 222 contacts the glass substrate 211 of the OLED panel 215 at a position in the longitudinal direction between the driver IC 215 and the position of the base holder 240 at which the base holder 240 contacts the OLED panel 210, irrespective of how the OLED panel 210 is fixed to the base holder 240.

(3) In the above embodiment, description is given while illustrating a state in which the support portion 222 of the lens holder 220 contacts the glass substrate 211 of the OLED panel 210. However, the support portion 222 may be provided in different manners as long as the tip of the support portion 222 is at a position at which deflection of the glass substrate 211 caused by the thermally conductive silicone member 260 can be suppressed. Accordingly, the support portion 222 may not necessarily be in contact with the glass substrate 211 when deflection of the glass substrate 211 is small and does not affect image quality.

(4) In the above embodiment, description is given taking a case in which the image forming device 1 is a tandem-type color printer as an example. However, the present invention of course should not be construed as being limited to this, and the image forming device 1 may be a color printer device of a type other than a tandem type or may be a monochrome printer. Further, the present invention achieves similar effects when applied to single-function peripherals such as copiers including a scanner device, facsimile devices having a facsimile communication function, and multi-function peripherals (MFPs) including all such functions.

[9] Summary

The above embodiments and modifications represent at least one aspect of the present invention, and are summarized as follows.

That is, an optical print head reflecting at least one aspect of the present disclosure includes: an elongated light source substrate that has a line-shaped region in which a plurality of light-emitting elements are arranged; an optical member that condenses light emitted from the light-emitting elements onto an irradiation target; a holding member that holds the optical member; a base member that holds the light source substrate and the holding member; an integrated circuit that is mounted in a first region on a first surface of the light source substrate, the first surface facing the base member and the first region being in proximity of an end in a longitudinal direction of the light source substrate, heat being generated in the integrated circuit during optical writing; and a thermally conductive member that is disposed between the integrated circuit and the base member, wherein the holding member has a support portion contacting the light source substrate in a second region on a second surface of the light source substrate, the second surface not facing the base member and the second region being at a position differing from the first region in plan view.

In this structure, the support portion of the holding member contacts the light source substrate in a second region on the second surface of the light source substrate at a position differing from the first region in plan view, where the second surface does not face the base member and the first region is a region in which the integrated circuit is mounted on the first surface of the light source substrate. This helps suppress deformation of the light source substrate because of a load in a vertical direction added due to a reaction force from the thermally conductive member. This further helps suppress conduction of heat from the integrated circuit to the holding member.

Further, in the optical print head, the holding member may be in contact with a positioning member defining a distance from the optical member to the irradiation target.

Further, in the optical print head, the support portion may contact the light source substrate at a position that is offset from a straight line extending from the position at which the positioning member contacts the holding member to the integrated circuit in plan view.

Further, in the optical print head, the support portion may contact the light source substrate at a position in the longitudinal direction of the light source substrate between the integrated circuit and the light-emitting elements.

Further, in the optical print head, the support portion may contact the light source substrate at a position in the longitudinal direction of the light source substrate between the integrated circuit and a position at which the base member contacts the light source substrate.

Further, in the optical print head, the light source substrate may include a substrate on which the plurality of light-emitting elements are mounted, a material for the base member may have greater thermal conductivity than a material for the substrate, and the material for the substrate may have greater thermal conductivity than a material for the holding member.

Further, in the optical print head, the support portion may protrude from a main body of the holding member toward the light source substrate, and a tip of the support portion contacting the light source substrate may be notched.

Further, in the optical print head, the support portion may protrude from a main body of the holding member toward the light source substrate, and a tip of the support portion contacting the light source substrate may be rounded toward the light source substrate.

Further, in the optical print head, the light-emitting elements may be organic light-emitting diodes.

An image forming device reflecting at least one aspect of the present disclosure includes an optical print head, including: an elongated light source substrate that has a line-shaped region in which a plurality of light-emitting elements are arranged; an optical member that condenses light emitted from the light-emitting elements onto an irradiation target; a holding member that holds the optical member; a base member that holds the light source substrate and the holding member; an integrated circuit that is mounted in a first region on a first surface of the light source substrate, the first surface facing the base member and the first region being in proximity of an end in a longitudinal direction of the light source substrate, heat being generated in the integrated circuit during optical writing; and a thermally conductive member that is disposed between the integrated circuit and the base member, wherein the holding member has a support portion contacting the light source substrate in a second region on a second surface of the light source substrate, the second surface not facing the base member and the second region being at a position differing from the first region in plan view.

Although one or more embodiments of the present invention have been described and illustrated in detail, the disclosed embodiments are made for the purposes of illustration and example only and not limitation. The scope of the present invention should be interpreted by the terms of the appended claims.

What is claimed is:

1. An optical print head, comprising:
an elongated light source substrate that has a line-shaped region in which a plurality of light-emitting elements are arranged;
an optical member that condenses light emitted from the light-emitting elements onto an irradiation target;
a holding member that holds the optical member;
a base member that holds the light source substrate and the holding member;
an integrated circuit that is mounted in a first region on a first surface of the light source substrate, the first surface facing the base member and the first region being in proximity of an end in a longitudinal direction of the light source substrate, heat being generated in the integrated circuit during optical writing; and
a thermally conductive member that is disposed between the integrated circuit and the base member, wherein
the holding member has a support portion contacting the light source substrate in a second region on a second surface of the light source substrate, the second surface not facing the base member and the second region being at a position differing from the first region in plan view.

2. The optical print head of claim 1, wherein
the holding member is in contact with a positioning member defining a distance from the optical member to the irradiation target.

3. The optical print head of claim 2, wherein
the support portion contacts the light source substrate at a position that is offset from a straight line extending from the position at which the positioning member contacts the holding member to the integrated circuit in plan view.

4. The optical print head of claim 1, wherein
the support portion contacts the light source substrate at a position in the longitudinal direction of the light source substrate between the integrated circuit and the light-emitting elements.

5. The optical print head of claim 1, wherein
the support portion contacts the light source substrate at a position in the longitudinal direction of the light source substrate between the integrated circuit and a position at which the base member contacts the light source substrate.

6. The optical print head of claim 1, wherein
the light source substrate includes a substrate on which the plurality of light-emitting elements are mounted,
a material for the base member has greater thermal conductivity than a material for the substrate, and
the material for the substrate has greater thermal conductivity than a material for the holding member.

7. The optical print head of claim 1, wherein
the support portion protrudes from a main body of the holding member toward the light source substrate, and
a tip of the support portion contacting the light source substrate is notched.

8. The optical print head of claim 1, wherein
the support portion protrudes from a main body of the holding member toward the light source substrate, and
a tip of the support portion contacting the light source substrate is rounded toward the light source substrate.

9. The optical print head of claim 1, wherein
the light-emitting elements are organic light-emitting diodes.

10. An image forming device comprising
an optical print head comprising:
  an elongated light source substrate that has a line-shaped region in which a plurality of light-emitting elements are arranged;
  an optical member that condenses light emitted from the light-emitting elements onto an irradiation target;
  a holding member that holds the optical member;
  a base member that holds the light source substrate and the holding member;
  an integrated circuit that is mounted in a first region on a first surface of the light source substrate, the first surface facing the base member and the first region being in proximity of an end in a longitudinal direction of the light source substrate, heat being generated in the integrated circuit during optical writing; and
  a thermally conductive member that is disposed between the integrated circuit and the base member, wherein
  the holding member has a support portion contacting the light source substrate in a second region on a second surface of the light source substrate, the second surface not facing the base member and the second region being at a position differing from the first region in plan view.

* * * * *